United States Patent [19]
Aiello et al.

[11] Patent Number: 6,057,578
[45] Date of Patent: May 2, 2000

[54] PROTECTIVE INTEGRATED STRUCTURE WITH BIASING DEVICES HAVING A PREDETERMINED REVERSE CONDUCTION THRESHOLD

[75] Inventors: Natale Aiello, Catania; Atanasio La Barbera, Palermo, both of Italy

[73] Assignee: STMicroelectronics S.r.l., Agrate Brianza, Italy

[21] Appl. No.: 09/195,912

[22] Filed: Nov. 19, 1998

[51] Int. Cl.[7] .................................................. H01L 23/62
[52] U.S. Cl. ........................... 257/355; 257/356; 257/546
[58] Field of Search ..................................... 257/352, 355, 257/356, 360, 546

[56] References Cited

U.S. PATENT DOCUMENTS

| | | | |
|---|---|---|---|
| 4,405,933 | 9/1983 | Avery | 357/13 |
| 4,543,593 | 9/1985 | Fujita | 357/48 |
| 4,633,283 | 12/1986 | Avery | 357/23.23 |
| 4,847,724 | 7/1989 | Renous | 361/91 |
| 4,897,757 | 1/1990 | Tailliet et al. | 361/91 |
| 5,521,414 | 5/1996 | Palara | 257/355 |
| 5,536,958 | 7/1996 | Shen et al. | 257/356 |
| 5,587,597 | 12/1996 | Reedy et al. | 257/351 |
| 5,596,216 | 1/1997 | Yangigawa | 257/355 |
| 5,610,426 | 3/1997 | Asai et al. | 257/360 |
| 5,648,676 | 7/1997 | Iwai et al. | 257/500 |
| 5,777,367 | 7/1998 | Zambrano | 257/355 |
| 5,869,882 | 2/1999 | Chen et al. | 257/605 |

FOREIGN PATENT DOCUMENTS

| | | | |
|---|---|---|---|
| 416805 | 3/1991 | European Pat. Off. | 257/577 |
| 3042100 | 9/1981 | Germany | 257/577 |
| 3504014689 | 2/1979 | Japan | 257/577 |

*Primary Examiner*—Mahshid Saadat
*Assistant Examiner*—Edgardo Ortiz
*Attorney, Agent, or Firm*—Allen, Dyer, Doppelt, Milbrath & Gilchrist, P.A. Attorneys at Law

[57] ABSTRACT

An integrated structure comprises a protective Zener diode connected between a first and a second terminal of the structure, and is formed in a chip of semiconductor material within an insulating region. The structure includes first and second biasing Zener diodes connected back-to-back between the first and the second terminals of the structure. The first and the second biasing diodes are disposed respectively in the opposite direction to and in the same direction as the protective diode, and having a common terminal connected to the insulating region. The protective diode has a reverse threshold voltage lower than a reverse threshold voltage of the second biasing diode.

24 Claims, 4 Drawing Sheets

PROTECTIVE INTEGRATED STRUCTURE WITH BIASING DEVICES HAVING A PREDETERMINED REVERSE CONDUCTION THRESHOLD

FIELD OF THE INVENTION

The present invention relates to the field of semiconductors, and more particularly, to a protective integrated structure with biasing devices having a predetermined reverse conduction threshold.

BACKGROUND OF THE INVENTION

Protective devices are used in many applications to limit the maximum voltage applied between two junctions of a circuit. For example, protective devices are connected between a gate terminal of a MOS field-effect transistor and a reference terminal (or ground) to protect the gate terminal from excess voltages, which might damage the insulating layer of the MOS transistor.

Typically, protective devices are formed by the back-to-back connection of two Zener diodes. When the voltage applied between the terminals of the protective device exceeds the reverse threshold voltage of one of the Zener diodes, this Zener diode becomes reverse conducting. The other Zener diode is forward conducting. As a result, a substantially constant voltage is maintained at the terminals of the protective device. The voltage level is a value equal to the reverse threshold voltage of the applicable Zener diode.

An example of an integrated structure comprising the protective device described above is illustrated in FIG. 1a. Concentrations of the n-type and p-type impurities are indicated by adding the sign + or the sign – to the letters n and p to indicate respectively, a high or low concentration of impurities. The letters n and p without the addition of the signs + or – indicate concentrations of intermediate value.

The protective structure, indicated by the reference numeral 100, is formed in a chip 105 of semiconductor material doped with n-type impurities. A p-type insulating region 110 delimits two portions 115, 116 of the chip 105. P+type regions 120, 121 are formed in portions 115, 116 respectively. N+ type regions 125, 126 are then formed within the respective regions 120, 121. The upper surface of the chip 105 is coated with an insulating layer 130. Also, there is a metallic track or line 135 which interconnects the regions 120 and 115, the regions 121 and 116, and the insulating region 110. Additional metallic tracks or lines 140, 141 are in contact with the respective regions 125, 126.

The equivalent circuit of the integrated structure described above comprises an n-p-n bipolar transistor Z1 formed by the n-type region 125 (emitter), the p-type region 120 (base) and the n-type region 115 (collector). The base terminal is connected through a resistor R1 to the collector terminal by track 135. Resistor R1 includes the sheet resistance of the region 120. The transistor Z1 forms a Zener diode whose anode and cathode terminals are formed by the respective tracks 135, 140. The transistor Z1 uses the non-destructive reverse breakdown of the surface p-n junction formed by the regions 120 and 125. An additional Zener diode is formed in a similar way by an n-p-n bipolar transistor Z2 having its base terminal connected to the collector terminal through a resistor R2. The collector terminals of the transistors Z1 and Z2 are connected together through the track 135. The tracks 140 and 141 form the external terminals of the protective structure 100.

Various parasitic components are also present in the integrated structure 100. In particular, a p-n-p parasitic transistor Tp1 is formed by the p-type region 121, the n-type region 116 (base) and the p type region 110 (collector). The emitter is in the reverse conducting phase of the transistor Z2. The emitter terminal of the transistor Tp1 is connected to the base terminal of the transistor Z2 (common region 121). The base terminal of the transistor Tp1 is connected to the collector terminal of the transistor Z2 (common region 116), and through the resistor R2 to the base terminal of the transistor Z2 (through the track or line 135).

An n-p-n parasitic transistor Tp2 is also formed by the n-type region 116 (emitter), the p-type region 110 (base) and the n-type region formed by the portion of the chip 105 outside the insulating region 110 (collector). The emitter terminal and the base terminal of the transistor Tp2 are respectively connected to the base terminal (common region 116), and to the collector terminal (common region 110) of the transistor Tp1. The base terminal of the transistor Tp2 is also connected through a resistor R3 to the base terminal of the transistor Tp1. Resistor R3 includes the resistance of the insulating region 110. Similar parasitic components not shown in the figure are associated with the transistor Z1.

Typically, the integrated structure described above is of a mixed signal and power type, in which both low-voltage signal devices and high-voltage power devices are integrated on the same chip 105. For example, reference is made to the circuit illustrated in FIG. 1b. The elements shown previously in FIG. 1a are identified by the same reference numbers or symbols in FIG. 1b. FIG. 1b shows a power device in an emitter-switching configuration comprising a high-voltage bipolar transistor Th and a low-voltage MOS field-effect transistor Ml. The emitter terminal of the high-voltage transistor Th is connected to the drain terminal of the low-voltage transistor Ml. Typically, the source terminal of the low-voltage transistor Ml is connected to a ground terminal. The collector terminal of the high-voltage transistor Th is connected to the first terminal of a load L whose second terminal is connected to the positive terminal of a power supply Vcc. The negative terminal of the power supply Vcc is connected to a ground terminal.

The protective structure 100 is used to limit the maximum (positive and negative) voltage applied to the gate terminal G of the low-voltage transistor Ml by connecting the terminals 140, 141 respectively to the gate terminal G and to a ground terminal. The collector region of the high-voltage transistor Th is formed in the portion of the chip 105 outside the insulating region. Therefore, the collector terminal of the parasitic transistor Tp2 is connected to the collector terminal of the high-voltage transistor Th.

As an illustrative example, the protective structure 100 is activated to limit the voltage between the terminals 140, 141 to a value V1. Consequently, a current I1 flows through the protective structure 100 in the direction shown in the FIG. 1b. In this situation, the transistor Z2 is reverse conducting and the transistor Z1 is forward conducting. The parasitic components associated with the transistor Z1 are negligible in this condition. When the voltage drop across the resistor R2 exceeds the threshold voltage Vbe (typically 0.6 V) of the transistor Tp1, the transistor Tp1 becomes forward conducting. The current supplied by the transistor Tp1 passes through the resistor R3. When the voltage drop across the resistor R3 exceeds the threshold voltage Vbe of the transistor Tp2, the transistor Tp2 also becomes forward conducting. This condition connects the terminal 140 to the portion of the chip 105 outside the insulating region 110.

This situation is particularly dangerous in the case illustrated in FIGS. 1a and 1b since the conduction of the parasitic transistor Tp2 connects the gate terminal G to the collector terminal of the high-voltage transistor Th. When the protective structure 100 is activated to limit the negative voltage at the gate terminal G, the device in an emitter-switching configuration has Th and M1 in a non-conducting state. Therefore, the collector terminal of the high-voltage transistor Th is at a high potential with a value which may be several hundred volts. The application of this voltage to the gate terminal G can therefore cause the destruction of the structure.

SUMMARY OF THE INVENTION

An object of the present invention is to overcome the above noted drawbacks. To achieve this object, an integrated structure comprising a first protective device is connected between a first and a second terminal of the integrated structure, and is formed in a chip of semiconductor material within an insulating region. The integrated structure includes first and second biasing devices connected back-to-back between the first and the second terminals of the structure. The first and the second biasing devices are disposed respectively in the opposite direction to and in the same direction as the first protective device, and have a common terminal connected to the insulating region. The first protective device has a reverse threshold voltage lower than a reverse threshold voltage of the second biasing device.

The integrated structure further comprises a second protective device connected back-to-back with the first protective device between the first and the second terminals. The second protective device has a reverse threshold voltage lower than a reverse threshold voltage of the first biasing device. The integrated structure further comprises at least one power device. The at least one power device is an emitter-switching configuration device and comprises a first transistor and a second transistor connected together. In one approach, the first transistor comprises a high-voltage bipolar transistor, and the second transistor comprises a low-voltage MOS transistor.

The protective integrated structure can withstand an operating current having a very high value. The protective integrated structure is immune to the effects associated with the conduction of parasitic components which might cause destruction of the structure.

BRIEF DESCRIPTION OF THE DRAWINGS

Further characteristics and advantages of the integrated structure according to the present invention will be understood from the following description of a preferred embodiment of the invention, provided for guidance only and without restriction, with reference to the attached figures, in which:

FIG. 1b shows a circuit comprising the integrated structure shown in FIG. 1a;

FIG. 2b shows a circuit comprising the integrated structure shown in FIG. 2a.

DETAILED DESCRIPTION OF THE PREFERRED EMBODIMENTS

Figure 2A:
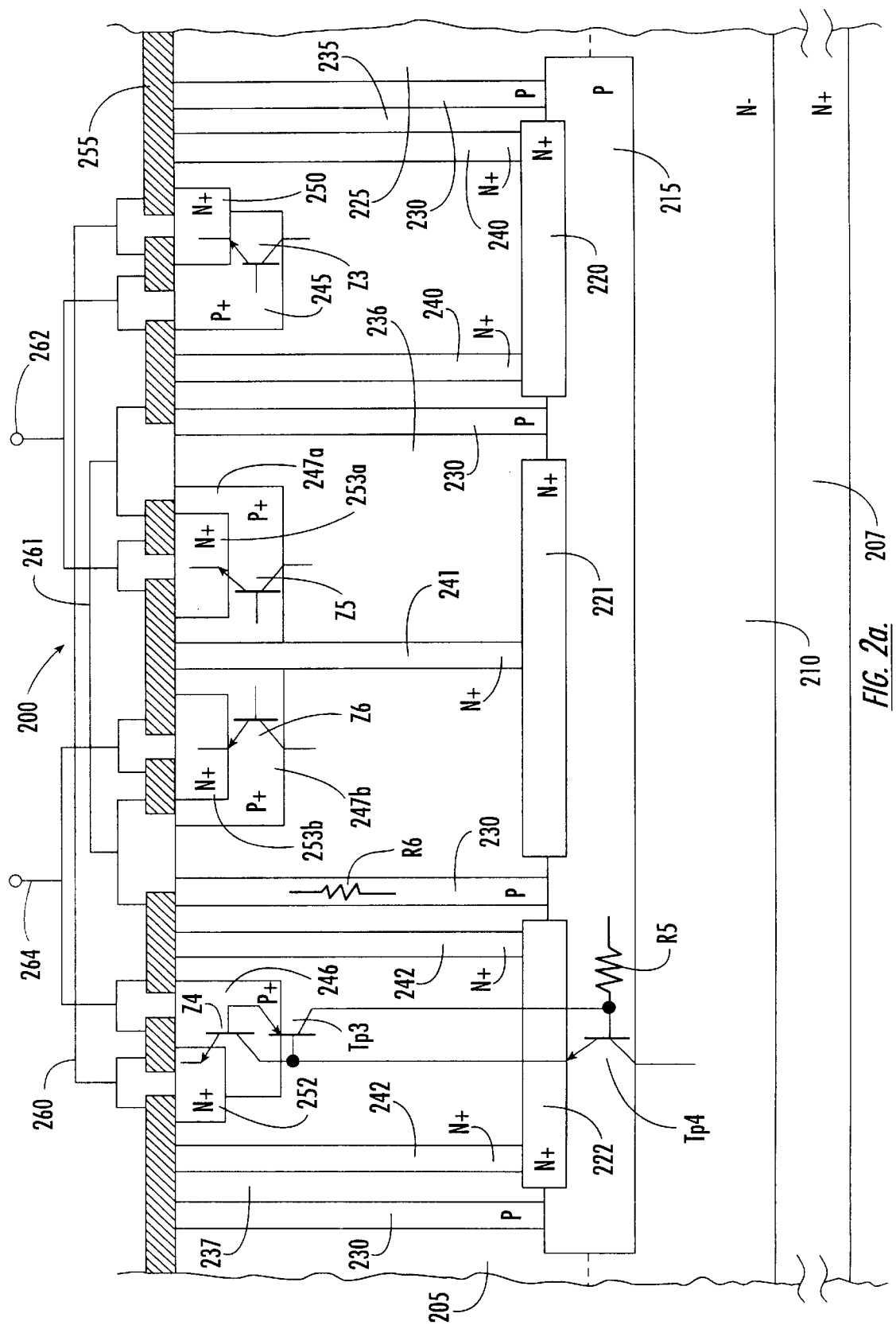
FIG. 2a shows a partial schematic view in section of a protective integrated structure, according to the present invention.

FIG. 2a illustrates a protective integrated structure 200 formed in a chip 205 of semiconductor material doped with n-type impurities. Equivalent considerations are applicable if the n-type regions are replaced by corresponding p-type regions, and vice versa. In particular, the integrated structure is a mixed signal and power type formed by using the VIPower™ process. VIPower is a trademark of SGS-Thomson Microelectronics S.r.l., and is described in European patent application EP-0322040, which is assigned to the assignee of the present invention. The present invention is also suitable for different production processes, e.g., with the signal and power devices integrated in different chips, using low-voltage components only, etc.

The chip 205 comprises a substrate 207 which is typically single-crystal silicon, and strongly doped with n-type impurities (n+). A layer 210 having the same type of conductivity, but with a low concentration of impurities (n−), is formed by epitaxial growth on the substrate 207. A p-type region 215 having an intermediate concentration of impurities (p) is formed by ion implantation and subsequent diffusion on the upper surface of the epitaxial layer 210. Three n+ type regions 220, 221 and 222 are then formed on the p-type region 215 by a subsequent stage of implantation and diffusion. A second n-type epitaxial layer 225 having a concentration of impurities greater than or equal to that of the first layer 210 is formed on the latter by epitaxial growth. This stage is carried out at high temperature, and the previously implanted p-type and n-type impurities are diffused further into the two epitaxial layers 210 and 225. This produces buried regions which form buried p-n junctions.

Various regions are then formed in the second epitaxial layer 225 by known methods of masking, implantation and diffusion. In particular, a p-type contact region 230 extends from an upper surface of the chip 205 to the buried region 215. The regions 215, 230 form an insulating region which delimits with the upper surface of the chip 205 three portions 235, 236 and 237 of the chip 205. These three portions 235, 236 and 237 respectively contain the buried regions 220, 221 and 222.

An n+ type contact region 240, 241, 242 extends from the upper surface of the chip 205 to the buried region 220, 221, 222. The contact regions 240 and 242 form in plan view a frame which respectively delimits an inner part of the portions 235 and 237, while the contact region 241 forms a strip dividing the portion 236 into two substantially equal parts.

A p+ type region 245, 246 extends from the upper surface of the chip 205 into the portion 235, 237, and in particular into the frame formed by the contact region 240, 242. A p+ type region extends from the upper surface of the chip 205 into the portion 236, being divided by the contact region 241 into two portions 247a and 247b. An n+ type region 250,252 extends from the upper surface of the chip 205 partly into the portion 235, 237 (in the part delimited by the contact region 240, 242), and partly into the region 245, 247. An n+ type region 253a, 253b extends from the upper surface of the chip 205 into the region 247a, 247b.

Conducting lines or tracks, e.g, metallic tracks, in contact with surface areas of the semiconductor chip 205 are then formed by known methods of deposition, masking and etching, on the upper surface of the chip 205. The upper surface of the chip is coated with an insulating layer 255, typically silicon dioxide. In particular, a track 260 interconnects the regions 250 and 252, and a track 261 interconnects the contact region 230, the portion 236 and the regions 247a and 247b. Additionally, a track 262 interconnects the regions 245 and 253a, and a track 264 interconnects the regions 246 and 253b.

The equivalent circuit of the integrated structure described above comprises an n-p-n bipolar transistor Z3 including the n-type region 250 (emitter), the p-type region 245 (base) and the n-type region 235 (collector). The n+ type regions 220 and 240 can be used advantageously to reduce the gain of a parasitic p-n-p transistor of the vertical type and of lateral type, respectively. The vertical type comprises p-region 245, n-region 235, 220 and p-region 215. The lateral type comprises p-region 245, n-region 235, 240 and p-region 230.

The transistor Z3 has its emitter terminal and collector terminal connected together through the region 250, and forms a Zener diode utilizes the nondestructive reverse breakdown of the surface p-n junction formed by the regions 245 and 250. The Zener diode has anode and cathode terminals formed by the track 262 and the track 260, respectively. An additional Zener diode is formed in a similar way by an n-p-n bipolar transistor Z4. The emitter terminals of the transistors Z3 and Z4 are connected together through the track 260. The tracks 262 and 264 form the external terminals of the protective structure 200.

The protective structure also includes an n-p-n bipolar transistor Z5 formed by the n-type region 253a (emitter), by the p-type region 247a (base) and by the n-type region 236 (collector). The n+ type region 241 can advantageously be used to eliminate a lateral parasitic n-p-n transistor formed by the n-region 253a, the p-region 247a, 247b and the n-region 253b. The transistor Z5 has its base terminal and its collector terminal connected together through the track 261 to form a Zener diode. The Zener diode has anode and cathode terminals formed by the respective tracks 261 and 262.

An additional Zener diode is formed in a similar way by an n-p-n bipolar transistor Z6. The collector terminals of the transistors Z5 and Z6 are connected together and to the insulating region 215, through the track 261. The emitter terminals of the transistors Z5 and Z6 are connected to the external terminals of the protective structure through the respective tracks 262 and 264. The Zener diodes formed by the transistors Z5 and Z6 have a reverse threshold voltage greater than a reverse threshold voltage of the Zener diodes formed by the transistors Z3 and Z4.

The integrated structure described above also includes various parasitic components. In particular, a p-n-p parasitic transistor Tp3 is formed by the p-type region 246, the n-type region 237, 222 (base) and the p-type region 215 (collector). The emitter is in the forward conducting phase of the transistor Z4. The emitter terminal and the base terminal of the transistor Tp3 are respectively connected to the base terminal (common region 246) and to the collector terminal (common region 237, 222) of the transistor Z4.

An n-p-n parasitic transistor Tp4 is also formed by the n-type region 237, 222 (emitter), by the p-type region 215 (base) and by the n-type epitaxial layer 210 (collector). The emitter terminal and the base terminal of the transistor Tp4 are respectively connected to the base terminal (common region 237, 222) and to the collector terminal (common region 215) of the transistor Tp3. The base terminal of the transistor Tp4 is also connected through a resistor R5 and a resistor R6 to the collector terminal of the transistor Z6. The resistor R5 includes the resistance formed by the region 215 in the vicinity of the region 222. The resistor R6 is formed by the resistance of the region 230. Similar parasitic components not shown in the figure are associated with the transistors Z3, Z5 and Z6.

Figure 1A:
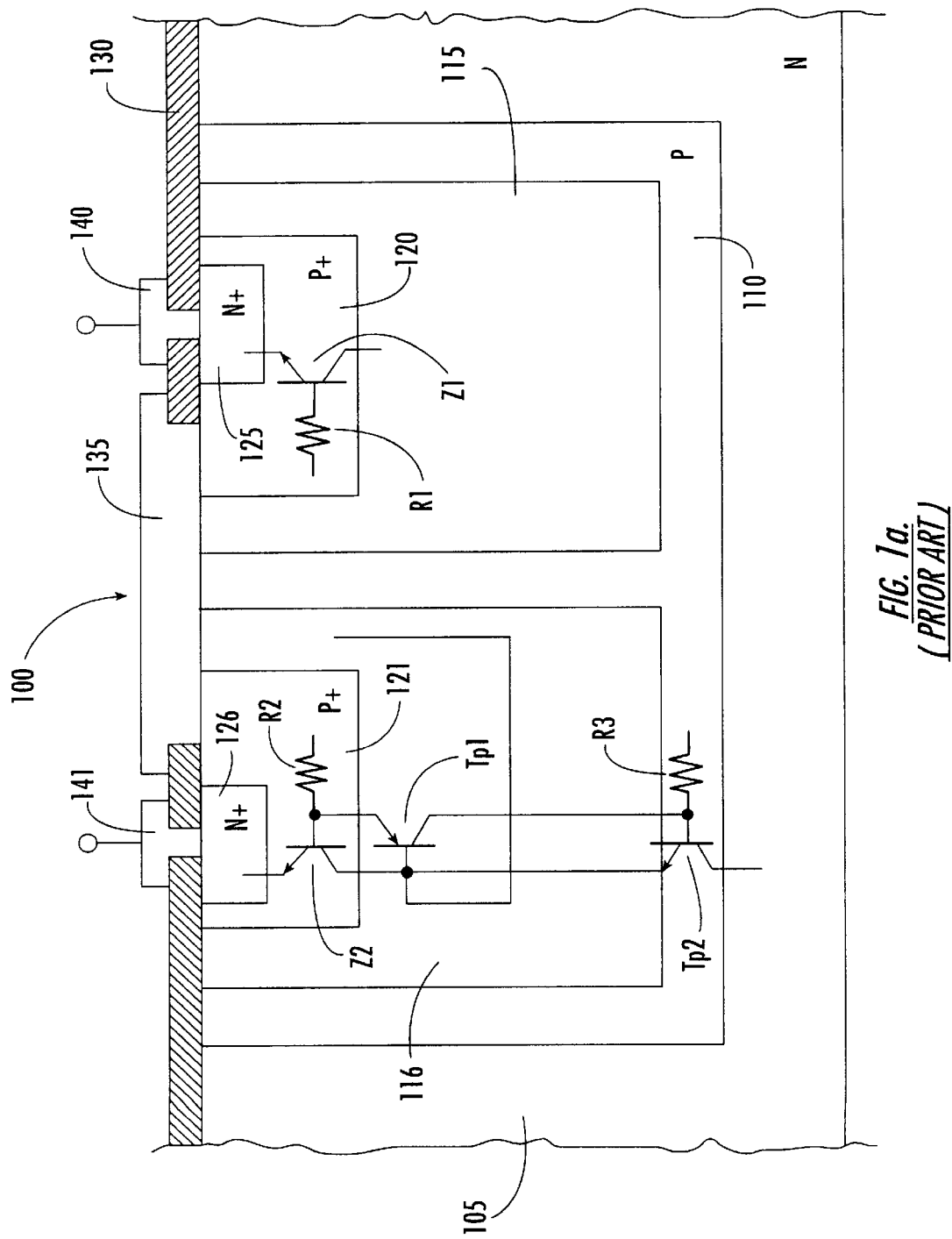
FIG. 1a shows a partial schematic view in section of a protective integrated structure, according to the prior art.
Figure 1B:
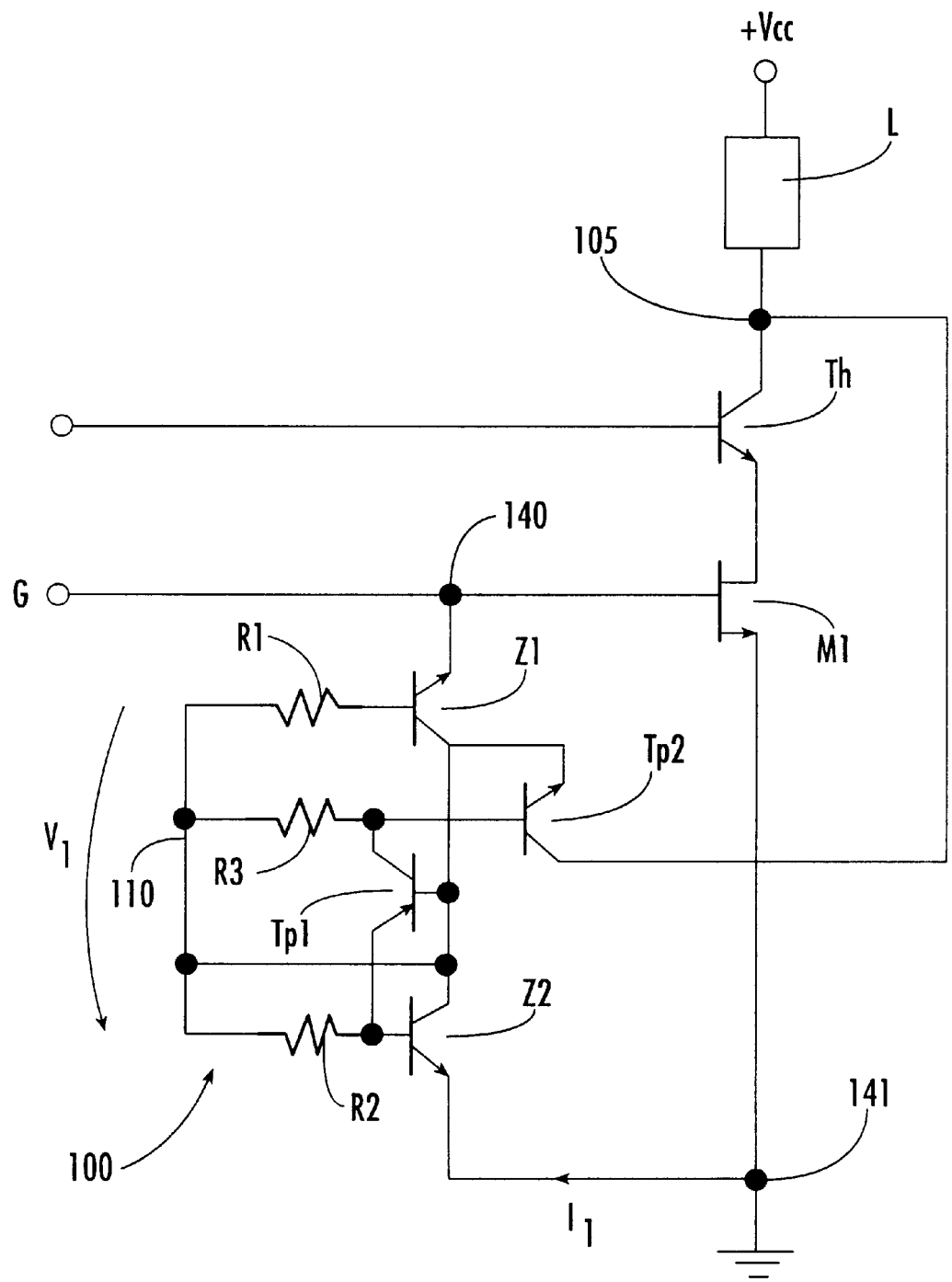
Figure 2B:
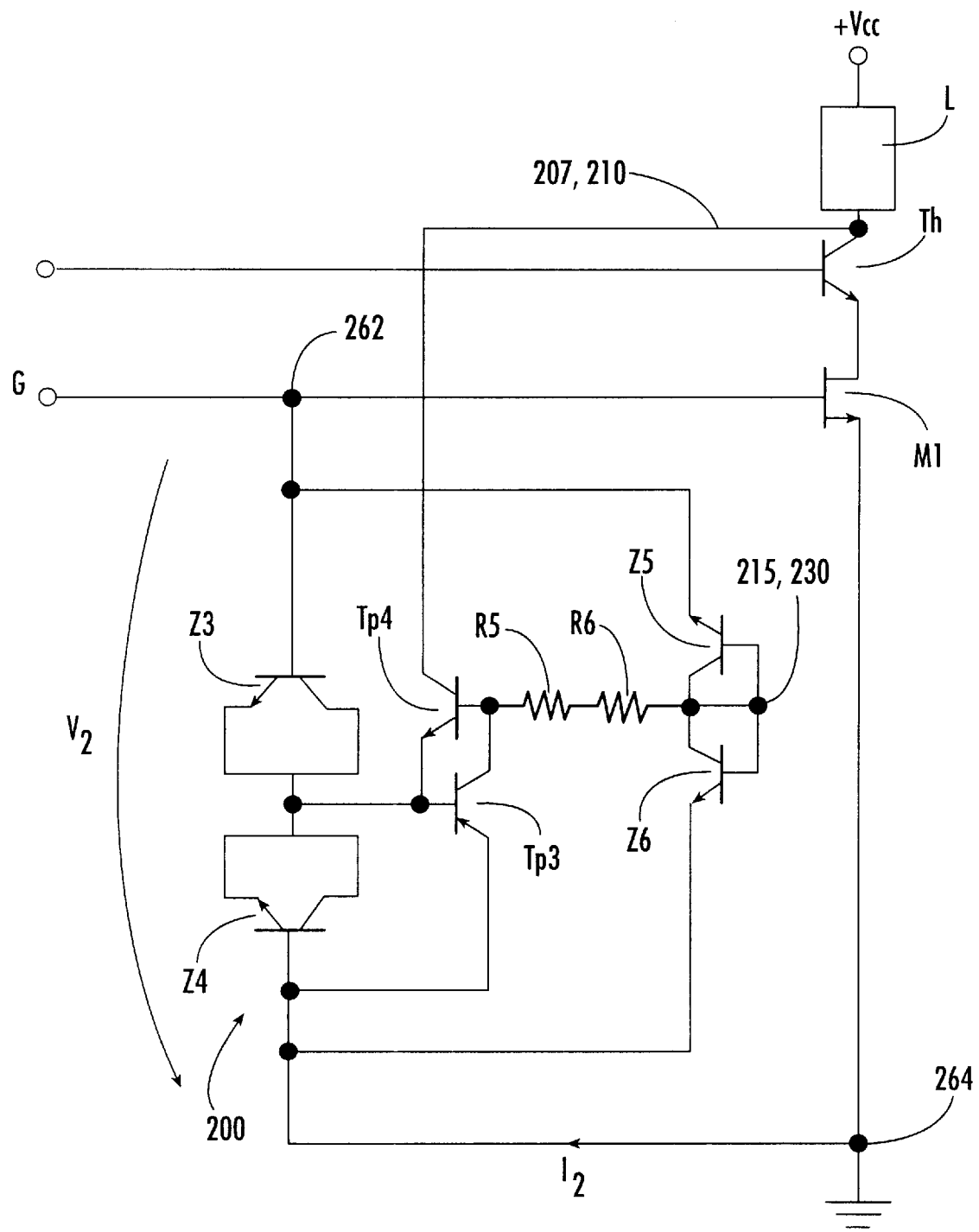

With reference to FIG. 2b, elements previously shown in FIGS. 1b and 2a are identified by the same reference numbers or symbols. The protective structure 200 is advantageously used with a power device in an emitter-switching configuration, as shown in FIG. 2b. The protective structure 200 can also be used with different power devices in other applications. For illustrative purposes, the protective structure 200 is activated to limit the voltage between the terminals 262 and 264 to a value V2. Therefore, a current I2 having the direction shown in the figure passes through the protective structure 200. The transistor Z3 is reverse conducting and the transistor Z4 is forward conducting. Consequently, the transistor Z5 is forward conducting, while the transistor Z6 is non-conducting. This is because its reverse threshold voltage is greater than the reverse threshold voltage of the transistor Z3.

In the circuit shown in FIG. 2b, the forward conduction of the transistor Z4 causes the transistor Tp3 to be forward conducting as well. The parasitic components associated with the transistors Z3, Z5 and Z6 are negligible in this condition. The current supplied by the transistor Tp3 passes through the resistors R5, R6. The current is sent to the external terminal formed by the track 262 through the transistor Z5. For the transistor Tp4 to become forward conducting, the voltage drop across the resistors R5, R6 must exceed the reverse threshold voltage of the transistor Z3, which has a fairly high value.

The protective integrated structure 200 according to the present invention can therefore withstand an operating current I2 having a very high value. The protective integrated structure 200 is also immune to the effects associated with the conduction of parasitic components which might cause destruction of the structure. The structure of the transistors Z5 and Z6 does not present the previously described problems arising from the activation of parasitic components, since these transistors never become reverse conducting.

Furthermore, the current I2 never passes through the transistors Z5 and Z6. These transistors are used only to polarize the insulating region 215, 230 by latching its voltage to that of the terminal 262 or 264 of the protective structure 200. Therefore, these transistors are of small size and do not have a significant effect on the overall size of the protective integrated structure 200.

Similar considerations are applicable when the transistor Z4 is reverse conducting, and the transistor Z3 is forward conducting. The present invention is also suitable for construction with different structures of the Zener diodes Z3–Z6, e.g., chains of Zener diodes connected in series. Also, construction with different structures includes other devices with a predetermined reverse conduction threshold equivalent to each other and connected back-to-back, i.e., with the anode or cathode terminals in common. In one alternative embodiment, a single Zener diode, e.g., Z3, is used. It is sufficient for only the Zener diode Z6, disposed in the matching direction, to have a reverse threshold voltage greater than that of the Zener diode Z3.

Clearly, a person skilled in the art may make numerous modifications and changes to the integrated structure described above to meet specific and contingent requirements. All such modifications and changes being included within the scope of protection of the invention.

That which is claimed is:

1. An integrated structure comprising:
   a semiconductor layer comprising a region having a first type of conductivity within an insulating region having a second type of conductivity;
   a first and a second terminal on said semiconductor layer;
   a common terminal on said semiconductor layer connected to the insulating region;

a first protective device formed in said semiconductor layer; and a first and a second biasing device connected back-to-back between said first and second terminals defining a predetermined reverse conduction threshold, said first and second biasing devices respectively disposed in a and in a generally same direction as said first protective device, said first protective device having a reverse threshold voltage lower than a reverse threshold voltage of said second biasing device;

a second protective device connected back-to-back with said first protective device between said first and said second terminals, said second protective device having a reverse threshold voltage lower than a reverse threshold voltage of said first biasing device; and wherein the insulating region delimits a surface of said semiconductor layer with a first portion, a second portion and a third portion, each portion for respectively forming said first protective device, said first and second biasing devices, and said second protective device.

2. An integrated structure according to claim 1, wherein the insulating region further comprises:

a first buried region; and a first contact region extending from the surface of said semiconductor layer to said first buried region.

3. An integrated structure according to claim 2, wherein each of said first and second protective devices further comprises:

a first region having the second type of conductivity, and extending from the surface of said semiconductor layer into both the first portion and the third portion; and a first metallic line and a second metallic line respectively in contact with a surface of said first region of said first and said second protective devices, said first and said second terminals being respectively formed.

4. An integrated structure according to claim 3, wherein each of said first and second protective devices further comprises:

a second region having the first type of conductivity, and extending from the surface of said semiconductor layer into said first region, and into both the first portion and the third portion; and a third metallic line in contact with a surface of said second region of said first protective device and with the surface of said second protective device.

5. An integrated structure according to claim 4, wherein each of the first and third portions further comprises:

a second buried region having the first type of conductivity, and forming a buried junction with said first buried region; and a second contact region having the first type of conductivity, and extending from the surface of said semiconductor layer to said second buried region around said first and second regions.

6. An integrated structure according to claim 5, further comprises:

a third region having the second type of conductivity, and extending from the surface of said semiconductor layer into the second portion;

a fourth region and a fifth region having the first type of conductivity, and extending from the surface of said semiconductor layer into said third region; and a fourth metallic line in contact with a surface of said third region, the second portion and the insulating region, and wherein each of said first and second metallic lines being respectively in contact with a surface of said fourth and fifth regions.

7. An integrated structure according to claim 6, wherein the second portion further comprises:

a third buried region having the first type of conductivity, and forming a buried junction with said first buried region; and a third contact region having the first type of conductivity, and extending from the surface of said semiconductor layer to said second buried region between said fourth region and fifth regions.

8. An integrated structure according claim 1, wherein the first type of conductivity comprises an n-type semiconductor material, and the second type of conductivity comprises a p-type semiconductor material.

9. An integrated structure according to claim 1, further comprising at least one power device formed in said semiconductor layer.

10. An integrated structure according to claim 9, wherein said at least one power device further comprises a device in an emitter-switching configuration comprising:

a bipolar transistor; and a MOS transistor having a drain connected to an emitter terminal of said bipolar transistor, said first terminal being connected to a gate terminal of said MOS transistor, and said second terminal being connected to a source terminal of said MOS transistor, and a collector terminal of said bipolar transistor being connected to a load.

a first and a second terminal on said semiconductor layer;

a common terminal on said semiconductor layer connected to the insulating region;

a first protective device formed in said semiconductor layer;

a first and a second biasing device connected back-to-back between said first and second terminals defining a predetermined reverse conduction threshold, said first and second biasing devices respectively disposed in a generally opposite direction to said first protective device and in a generally same direction as said first protective device, said first protective device having a reverse threshold voltage lower than a reverse threshold voltage of said second biasing device; and a second protective device connected back-to-back with said first protective device between said first and said second terminals.

11. An integrated structure comprising:

a semiconductor layer comprising a region having a first type of conductivity within an insulating region having a second type of conductivity;

a first and a second terminal on said semiconductor layer;

a common terminal on said semiconductor layer connected to the insulating region;

a first protective device formed in said semiconductor layer;

a first and a second biasing device connected back-to-back between said first and second terminals defining a predetermined reverse conduction threshold, said first and second biasing devices respectively disposed in a generally same direction as said first protective device, said first protective device having a reverse threshold voltage lower than a reverse threshold voltage of said second biasing device;

a second protective device connected back-to-back with said first protective device between said first and said second terminals; and wherein the insulating region delimits a surface of said semiconductor layer with a first portion, a second portion and a third portion, each portion for respectively forming said first protective device, said first and second biasing devices, and said second protective device.

12. An integrated structure according to claim 11, wherein said second protective device comprises a reverse threshold voltage lower than a reverse threshold voltage of said first biasing device.

13. An integrated structure according to claim 11, wherein the insulating region comprises:

a first buried region; and a first contact region extending from the surface of said semiconductor layer to said first buried region.

14. An integrated structure according to claim 13, wherein each of said first and second protective devices further comprises:

a first region having the second type of conductivity, and extending from the surface of said semiconductor layer into both the first portion and the third portion; and a first metallic line and a second metallic line respectively in contact with a surface of said first region of said first and said second protective devices, said first and said second terminals being respectively formed.

15. An integrated structure according to claim 14, wherein each of said first and second protective devices further comprises:

a second region having the first type of conductivity, and extending from the surface of said semiconductor layer into said first region, and into both the first portion and the third portion; and a third metallic line in contact with a surface of said second region of said first protective device and with the surface of said second protective device.

16. An integrated structure according to claim 15, wherein each of the first and third portions further comprises:

a second buried region having the first type of conductivity, and forming a buried junction with said first buried region; and a second contact region having the first type of conductivity, and extending from the surface of said semiconductor layer to said second buried region around said first and second regions.

17. An integrated structure according to claim 16, further comprises:

a third region having the second type of conductivity, and extending from the surface of said semiconductor layer into the second portion;

a fourth region and a fifth region having the first type of conductivity, and extending from the surface of said semiconductor layer into said third region; and a fourth metallic line in contact with a surface of said third region, the second portion and the insulating region, and wherein each of said first and second metallic lines being respectively in contact with a surface of said fourth and fifth regions.

18. An integrated structure according to claim 17, wherein the second portion further comprises:

a third buried region having the first type of conductivity, and forming a buried junction with said first buried region; and a third contact region having the first type of conductivity, and extending from the surface of said semiconductor layer to said second buried region between said fourth and fifth regions.

19. An integrated structure according claim 11, wherein the first type of conductivity comprises an n-type semiconductor material, and the second type of conductivity comprises a p-type semiconductor material.

20. An integrated structure according to claim 11, further comprising at least one power device formed in said semiconductor layer.

21. An integrated structure according to claim 20, wherein said at least one power device further comprises a device in an emitter-switching configuration comprising:

a bipolar transistor; and a MOS transistor having a drain connected to an emitter terminal of said bipolar transistor, said first terminal being connected to a gate terminal of said MOS transistor, and said second terminal being connected to a source terminal of said MOS transistor, and a collector terminal of said bipolar transistor being connected to a load.

22. A method of limiting a maximum voltage applied between a first and a second terminal of an integrated circuit that includes an insulating region, the method comprising the steps of:

connecting a first protective device with a predetermined reverse conduction threshold between the first and the second terminals; and connecting a first and a second biasing device defining a predetermined reverse conduction threshold back-to-back between the first terminal and the second terminal, the first biasing device and the second biasing device respectively disposed [in a generally opposite direction to the first protective device and] in a generally same direction as the first protective device, the first protective device having a reverse threshold voltage lower than a reverse threshold voltage of the second biasing device, and the second protective device having a reverse threshold voltage lower than a reverse threshold voltage of the first biasing device;

connecting a second protective device back-to-back with the first protective device between the first and second terminals, wherein the insulating region delimits a surface of the semiconductor layer with a first portion, a second portion and a third portion, each portion for respectively forming said first protective device. the first and second biasing surfaces and second protective device.

23. A method according to claim 22, further comprising the step of connecting at least one power device in an emitter-switching configuration between the first and second terminals.

24. A method according to claim 23, wherein the step of connecting at least one power device further comprises the steps of:

connecting a drain terminal of a second transistor to an emitter terminal of a first transistor;

connecting the first terminal to a gate terminal of the second transistor;

connecting the second terminal to a source terminal of the second transistor; and connecting a collector of the first transistor to a load.

* * * * *

UNITED STATES PATENT AND TRADEMARK OFFICE
CERTIFICATE OF CORRECTION

PATENT NO. : 6,057,578
DATED : May 2, 2000
INVENTOR(S) : Aiello et al.

It is certified that error appears in the above-indentified patent and that said Letters Patent is hereby corrected as shown below:

On the title page:

| | | |
|---|---|---|
| Item [30] Foreign Application Priority Data | Insert: Dec. 2, 1997 | Foreign Application Priority Data [IT]   Italy .......... MI 97 A 002675 |
| Column 10, lines 32-33: | Delete: [in a generally opposite direction to the first protective device and] | |

Signed and Sealed this

Twentieth Day of March, 2001

Attest:

NICHOLAS P. GODICI

*Attesting Officer*    *Acting Director of the United States Patent and Trademark Office*